(12) United States Patent
Kuras et al.

(10) Patent No.: US 10,404,239 B2
(45) Date of Patent: Sep. 3, 2019

(54) CONTROL SYSTEM FOR CONTROLLING OPERATION OF A MACHINE BY IMPOSING SHAPED HYSTERISIS

(71) Applicant: Caterpillar Inc., Peoria, IL (US)

(72) Inventors: Brian D. Kuras, East Peoria, IL (US); Michael J. Barngrover, Brimfield, IL (US); Sangameshwar Sonth, Dunlap, IL (US)

(73) Assignee: Caterpillar Inc., Deerfield, IL (US)

( * ) Notice: Subject to any disclaimer, the term of this patent is extended or adjusted under 35 U.S.C. 154(b) by 446 days.

(21) Appl. No.: 15/172,224

(22) Filed: Jun. 3, 2016

(65) Prior Publication Data

US 2017/0351230 A1 Dec. 7, 2017

(51) Int. Cl.
*H03K 3/037* (2006.01)

(52) U.S. Cl.
CPC .................................. *H03K 3/0377* (2013.01)

(58) Field of Classification Search
CPC .............................. G05B 15/02; H03K 3/0377
See application file for complete search history.

(56) References Cited

U.S. PATENT DOCUMENTS

| | | | |
|---|---|---|---|
| 4,141,242 A | 2/1979 | Scott | |
| 4,368,427 A | 1/1983 | Hayashi et al. | |
| 4,599,697 A | 7/1986 | Chan et al. | |
| 4,856,523 A | 8/1989 | Sholder et al. | |
| 4,890,516 A | 1/1990 | Suzuki | |
| 5,182,711 A | 1/1993 | Takahashi et al. | |
| 8,594,914 B2 | 11/2013 | Bauerle et al. | |
| 2016/0164382 A1* | 6/2016 | Moura | H01L 21/67259 310/68 B |
| 2017/0166241 A1* | 6/2017 | Kim | B62D 5/0457 |

* cited by examiner

*Primary Examiner* — Nathan L Laughlin
(74) *Attorney, Agent, or Firm* — Oblon, McClelland, Maier & Neustadt

(57) ABSTRACT

A control system for a machine having at least one control element is disclosed. The control system includes multiple input sensors in communication with the control element. The input sensor generates an input signal based on an input to the control element. The control system includes multiple actuating members to control operations of the machine. The control system includes a controller in communication with the input sensors and the actuating members. The controller receives the input signal from the input sensor and determines an imposed hysteresis level corresponding to the input signal based on a hysteresis input function. The controller is further configured to generate a hysteresis conditioned input signal based on the imposed hysteresis level.

20 Claims, 5 Drawing Sheets

CONTROL SYSTEM FOR CONTROLLING OPERATION OF A MACHINE BY IMPOSING SHAPED HYSTERISIS

TECHNICAL FIELD

The present disclosure relates generally to control systems and, more particularly, relates to a control system for controlling operations of a machine having at least one control element.

BACKGROUND

Machines include a number of control elements such as brake pedal, accelerator pedal, clutch pedal, gear and the steering system that are adapted to receive operator inputs pertaining to an intended operation of the machine. The control elements give control signals to a controller for accordingly controlling operations of the machine. Typically, the control elements are connected to sensors. The sensors generate signals based on the operator input to the control element and communicate the control signals to the controller. The signals received from the sensors are susceptible to noise, and therefore filtering of the signals is carried out. The controller implements conventional filters for mitigating the noise in the signals received from the sensors. However, sometimes the filters provide sluggish performance due to their inherent behavior. Hence, the controller implements hysteresis techniques for conditioning the signals received from the sensors. The hysteresis techniques may cause an undesirable steady state error in response when an operator provides an input to any of the control element for controlling operations of the machine. The undesirable steady state error in response in controlling operation of the machine is not a desirable characteristic of the machine when the input provided by the operator is at or near zero and at or near a maximum input range of the input device.

U.S. Pat. No. 5,182,711 hereinafter referred to as '711 patent, discloses motor control system for controlling a steering apparatus with an electric motor. In particular, according to the '711 patent, a command signal is generated in accordance with a torsion torque of the steering apparatus and the rotational direction. A torque of the electric motor is controlled in accordance with the command signal. The motor control system includes a vehicle speed sensor and a hysteresis circuit for changing a hysteresis width in accordance with an output from the vehicle speed sensor. The motor control system also includes a phase compensation designating section responsive to an output from the torsion torque sensor supplied via the hysteresis circuit for outputting a command signal corresponding to a change rate of the torsion torque. The rotation direction and torque of the electric motor is controlled in accordance with the command signal. The hysteresis circuit makes large the hysteresis width during a high speed running of a vehicle to avoid influence of external disturbance due to vibrations from roads. The motor control system of '711 patent modifies the hysteresis width of the steering apparatus as a function of speed of the vehicle.

SUMMARY OF THE DISCLOSURE

In one aspect, the present disclosure is directed to a control system for a machine having at least one control element. The control system includes at least one input sensor in communication with the at least one control element. The at least one input sensor generates an input signal indicative of an input to the at least one control element. The control system further includes one or more actuating members configured to control operations of the machine. The control system further includes a controller in communication with each of the at least one input sensor and the one or more actuating members. The controller is configured to receive the input signal indicative of the input to the at least one control element from the at least one input sensor. The controller is further configured to determine an imposed hysteresis level corresponding to the input signal based on a hysteresis input function. The controller is further configured to generate a hysteresis conditioned input signal based on the imposed hysteresis level.

In another aspect, the present disclosure is directed to a method of controlling operations of a machine having at least one control element. The method includes receiving an input signal indicative of an input to at least one control element. The method further includes determining an imposed hysteresis level corresponding to the input signal using a hysteresis input function. The method also includes generating a hysteresis conditioned input signal based on the imposed hysteresis level.

In yet another aspect, the present disclosure discloses a machine. The machine includes at least one control element, and at least one input sensor in communication with the at least one control element. The at least one input sensor generates an input signal indicative of an input to the at least one control element. The machine further includes one or more actuating members configured to control operations of the machine. The control system further includes a controller in communication with each of the at least one input sensor and the one or more actuating members. The controller is configured to receive the input signal indicative of the input to the at least one control element from the at least one input sensor. The controller is further configured to determine an imposed hysteresis level corresponding to the input signal based on a hysteresis input function. The controller is further configured to generate a hysteresis conditioned input signal based on the imposed hysteresis level.

Other features and aspects of this disclosure will be apparent from the following description and the accompanying drawings.

DETAILED DESCRIPTION

Reference will now be made in detail to specific embodiments or features, examples of which are illustrated in the accompanying drawings. Wherever possible, corresponding or similar reference numbers will be used throughout the drawings to refer to the same or corresponding parts.

Figure 1:
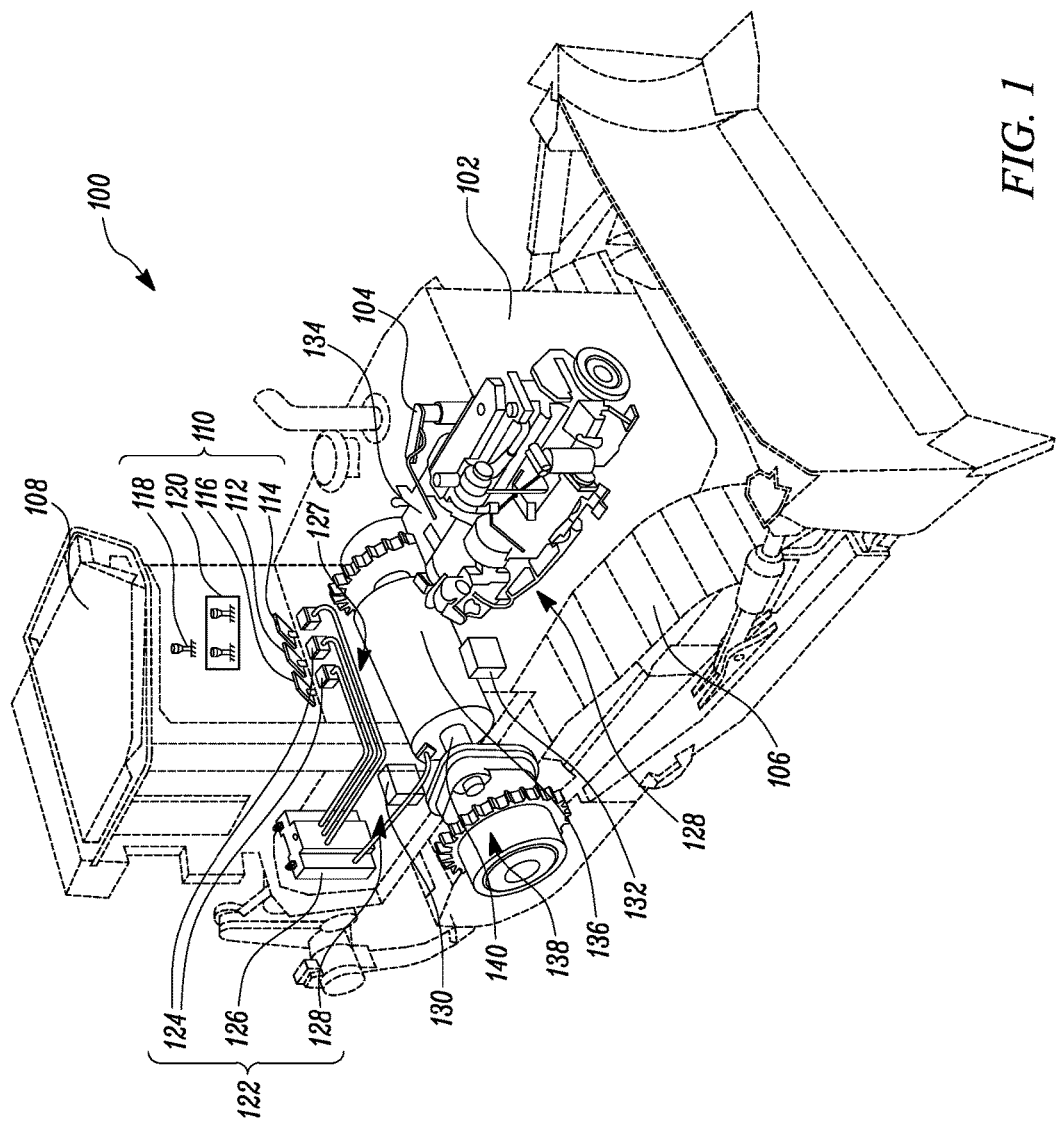
FIG. 1 is an illustration of a machine equipped with a control system, according to one embodiment of present disclosure.

FIG. 1 is an illustration of an exemplary machine 100, according to one embodiment of the present disclosure. The machine 100 may be a mobile machine that performs some type of operation associated with an industry such as mining, construction, farming, transportation, or another industry known in the art. As illustrated, the machine 100 may embody a track type tractor. However, it may be contemplated that the machine 100 may be an earth-moving machine such as a track-type dozer, loader, excavator, agricultural tractor, or haul machine.

As illustrated in FIG. 1, the machine 100 may include, but not limited to, a frame 102, and an engine 104 mounted to the frame 102 of the machine 100. The engine 104 may be one or a combination of an internal combustion engine, a gas turbine, a hybrid engine, and a non-conventional power source like batteries, fuel cell, or any other power source known in the art. The machine 100 also includes a plurality of ground engaging members 106 to enable mobility of the machine 100. In the present embodiment, the plurality of ground engaging members 106 may include a set of traction devices or tracks. In another embodiment, the plurality of ground engaging members 106 may include a set of wheels disposed each at the front end and rear end of the machine 100. In yet another embodiment, the plurality of ground engaging members 106 may include a combination of wheels and tracks.

An operator cabin 108 is mounted to the frame 102 of the machine 100. The operator cabin 108 includes at least one operator seat (not shown). The operator cabin 108 further includes multiple control elements 110 adapted to receive an input from the operator. The control elements 110 may be hereinafter interchangeably referred to as "control element 110" and "control elements 110" without any limitations. The input provided to the control elements 110 allows controlling operations of the machine 100. In an example, the operations of the machine 100 may include, but are not limited to, acceleration, braking, application of clutch, steering of the machine 100. In the present embodiment, the control elements 110 are positioned within the operator cabin 108 such that the control elements 110 are operable by an operator occupying the operator seat within the operator cabin 108. Alternatively, the control elements 110 may be positioned at a remote location.

In one embodiment, the control elements 110 may include, but are not limited to, an accelerator pedal 116. The accelerator pedal 116 is hereinafter interchangeably referred to as a go pedal 116. The control element 110 further includes a clutch pedal 114, a brake pedal 112. The brake pedal 112 is hereinafter interchangeably referred to as a slow down pedal 112. The control elements 110 further includes a joystick 118 and multiple steering lever inputs 120. The steering lever inputs 120 may be a finger tip control steering. The control elements 110 of the machine 100 perform multiple operations of the machine 100.

For accelerating the machine 100, the go pedal 116 is pressed or released by the operator, and accordingly, the machine 100 is accelerated or decelerated. Similarly, for stopping or slowing down the machine 100, the slow down pedal 112 is pressed or released by the operator and thereupon controlling the speed of the machine 100. On pressing or releasing of the slow down pedal 112 by the operator, the machine 100 is accelerated or decelerated. Further, for steering the machine 100, the steering lever inputs 120 and/or the joystick 118 may be operated. The steering lever inputs 120 may be maneuvered or the joystick 118 may be maneuvered to accordingly change the direction of movement of the machine 100. The joystick 118 may also be operated to ask for forward, neutral or reverse of the machine 100 and thus the operator may be able to request directional shifts of the machine 100.

Figure 2:
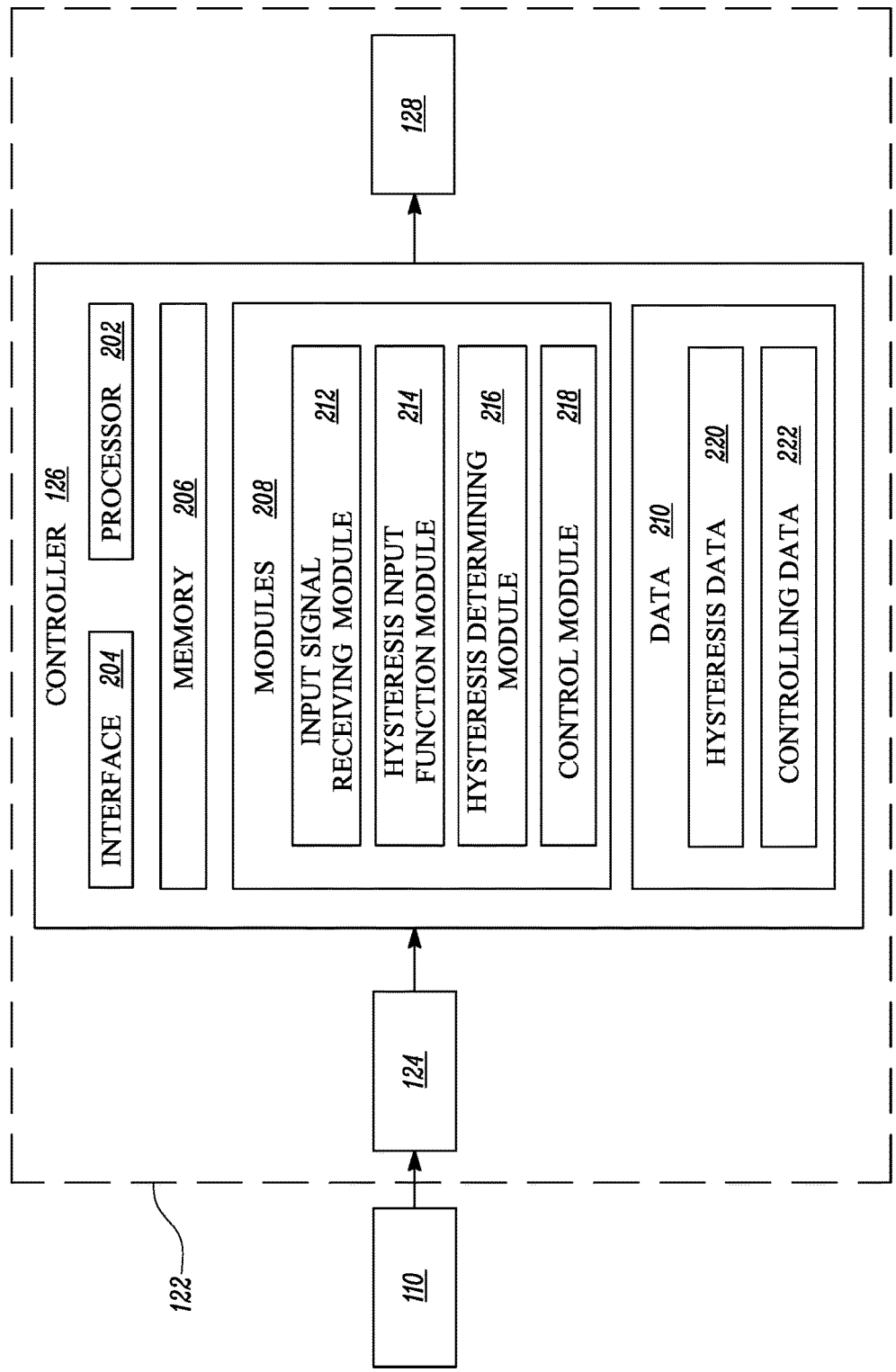
FIG. 2 is a block diagram of the control system in communication with control elements of the machine of FIG. 1, according to one embodiment of present disclosure.

Referring to FIG. 1 and FIG. 2, the machine 100 further includes a control system 122 for controlling the operation of the machine 100. In the present embodiment, the control system 122 includes multiple components such as, but is not limited to, at least one input sensor 124, a controller 126, and at least one actuating member 128.

The control elements 110 of the machine 100 are communicably coupled to the input sensors 124 of the control system 122. The input sensors 124 may be hereinafter interchangeably referred to as "input sensors 124" and "at least one input sensor 124" without any limitations. The input sensors 124 detect an input provided to the control elements 110. The input sensors 124 may be at least one of a digital type sensor and an analog type sensor. The input sensors 124 may also embody contact type or contactless type sensors known in the art, without limiting the scope of the present disclosure.

In one example, the input sensors 124 may be adapted to measure angular displacement 'θ' of the control elements 110 such as the angular displacement 'θ' of the go pedal 116, the angular displacement 'θ' of the clutch pedal 114 and the angular displacement 'θ' of the slow down pedal 112. For instance, the input sensors 124 may be communicably coupled with the go pedal 116 of the machine 100. The input sensors 124 measure the input provided to the go pedal 116 by the operator, by measuring change of angular displacement 'θ' of the go pedal 116. The input to the go pedal 116 may be one of press (acceleration) and release (deceleration) of the go pedal 116.

In another example, multiple steering lever input displacement sensors (not shown) may be connected to the steering lever inputs 120. The steering lever input displacement sensors may measure an input provided to the steering lever inputs 120. Further, transmission sensors known in the art may be communicably coupled to at least one of the joystick 118 and a gear (not shown) of the machine 100. In yet another example, the slow down pedal 112 may be communicably coupled to a brake angular displacement sensor (not shown) to measure the angular displacement of the slow down pedal 112. In addition the slow down pedal 112 may be communicably coupled to a brake switch (not shown) to measure a slow down pedal position.

The input sensors 124, based on the input provided to the control elements 110, generate an input signal. Therefore, the input signal generated by the input sensors 124 is indicative of the input to the at least one control element, such as go pedal 116, and the steering lever inputs 120. The input signal generated by the input sensors 124 are communicated to the controller 126. The input sensors 124 are communicably connected to the controller 126 by means of a wired network 127. In one example, the input sensors 124 may be connected to the controller 126 over a wired network 127 such as, but not limited to, a Controller Area Network (CAN) bus. Alternatively, the controller 126 may be communicably connected to the input sensors 124 over a wireless network.

The controller 126 may embody a single or multiple microprocessors, Field Programmable Gate Arrays (FPGAs), Digital Signal Processors (DSPs), and an Electronic Control Unit (ECU) that form one or more modules for controlling the operations of the machine 100. Numerous commercially available microprocessors can be configured to perform the functions of the controller 126. It should be appreciated that the controller 126 could readily embody a microprocessor separate from that controlling other machine functions or that the controller 126 could be integral with a general machine microprocessor and be capable of controlling numerous machine functions. If separate from the general machine microprocessor, the controller 126 may communicate with the general machine microprocessor via data links or other methods. Various other known circuits may be associated with the controller 126, including power supply circuitry, signal-conditioning circuitry, actuator driver circuitry (i.e., circuitry powering solenoids, motors, or other actuators), communication circuitry, and other appropriate circuitry. The operational characteristics and constructional details of the controller 126 are explained in detail in the description of FIG. 2.

Referring to FIG. 2, the block diagram of the control system 122, the controller 126 includes a processor 202, an interface 204, and a memory 206 coupled to the processor 202. The processor 202 is configured to fetch and execute computer readable instructions stored in the memory 206. In one embodiment, the processor 202 may be implemented as one or more microprocessors, microcomputers, microcontrollers, digital signal processors, central processing units, state machine, logic circuitries or any devices that manipulate signals based on operational instructions.

The interface 204 facilitates multiple communications within wide variety of protocols and networks, such as a wired network. Further, the interface 204 may include a variety of software and hardware interfaces. In one embodiment, the interface 204 may include one or more ports for connecting the controller 126 to an output unit (not shown).

In one example, the memory 206 may include any non-transitory computer-readable medium known in the art. In one example, the non-transitory computer-readable medium may be a volatile memory, such as static random access memory and a non-volatile memory, such as read-only memory, erasable programmable ROM, and flash memory.

The controller 126 further includes modules 208 and data 210. The modules 208 includes, but not limited to, routines, programs, objects, components, and data structures for performing particular tasks or implementing particular abstract data types. In one embodiment, the modules 208 include an input signal receiving module 212, a hysteresis input function module 214, and a hysteresis determining module 216, and a control module 218. The data 210 inter alia includes repository for storing data processed, received, and generated by one or more of the modules 208. The data 210 includes a hysteresis data 220 and a controlling data 222.

The input signal receiving module 212 of the controller 126 receives the input signal from the input sensors 124. The input signal receiving module 212, in turn, identifies the control elements 110 actuated by the operator based on the input signal. In one embodiment, data pertaining to the input signal receiving module 212 may be stored in the hysteresis data 220.

Figure 5:
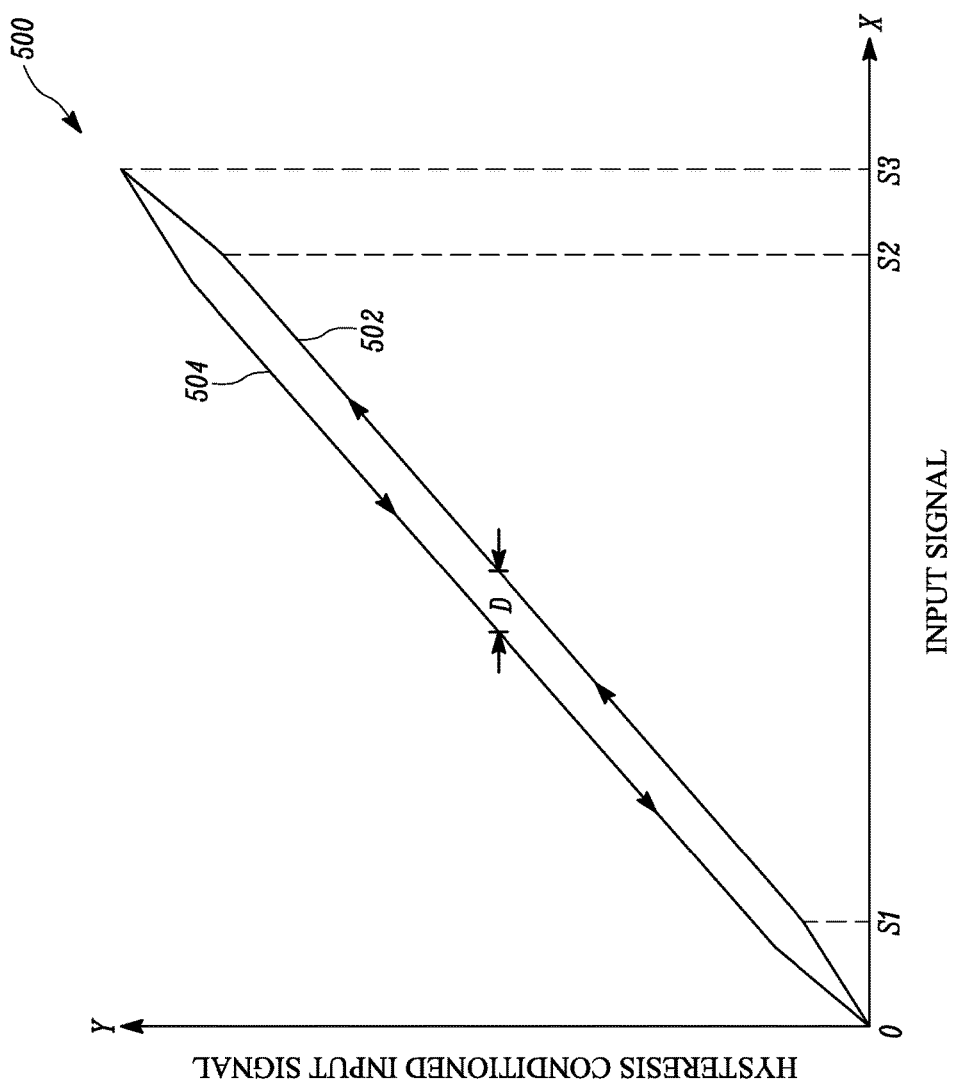
FIG. 5 is a graphical representation of an imposed hysteresis level determined based on the hysteresis input function of FIG. 4.

The input signal receiving module 212 communicates the input signal to the hysteresis input function module 214 of the controller 126. The hysteresis input function module 214 includes a hysteresis input function. In the preferred embodiment, the hysteresis input function comprises a set of input signals and multiple imposed hysteresis level corresponding to each of the input signal from the set of input signals. The imposed hysteresis level is also referred to as a deadband 'D' as shown in FIG. 5. In another embodiment, the hysteresis input function may be a variable function of the input signal indicative of the input to the control elements 110. In one example, the hysteresis input function may be at least one of a lookup table and a mathematical function. The hysteresis input function may be different for each of the control elements 110 of the machine 100. In one example, the hysteresis input function may also vary based on the type of the machine 100. The hysteresis input function module 214 identifies the hysteresis input function corresponding to the control element 110 which receives input from the operator.

The hysteresis input function module 214 further determines the imposed hysteresis level. In order to determine the imposed hysteresis level, values of the input signal are applied to the hysteresis input function. An exemplary hysteresis input function is explained in detailed with reference to FIG. 4. In one example, data pertaining to the hysteresis input function module 214 may be stored in the hysteresis data 220. In one example, the hysteresis input function module 214 may include a set of computer readable instructions corresponding to a hysteresis computation for determining the imposed hysteresis level. In one example, data pertaining to the hysteresis input function module 214 may be stored in the hysteresis data 220. The imposed hysteresis level depends on a specification of the machine 100 and a type of control element 110. The specification of the machine 100 may be defined as per at least one of, but is not limited to, a type of the machine 100, and cubic capacity of the engine 104 of the machine 100.

The hysteresis determining module 216 receives the imposed hysteresis level determined by the hysteresis input function module 214. In addition, the hysteresis determining module 216 receives the input signal from the input signal receiving module 212. The hysteresis determining module 216 generates a hysteresis conditioned input signal based on the input signal and the imposed hysteresis level. The hysteresis determining module 216 may include a set of computer readable instructions for computing hysteresis, as is known in the art, without limiting the scope of present disclosure. The hysteresis determining module 216 further communicates the hysteresis conditioned input signal to the control module 218. The control module 218 generates an output signal based on the hysteresis conditioned input signal. The control module 218 includes a control software loop. The control module 218 communicates the output signal to the actuating members 128 of the machine 100 for controlling the operations of the machine 100. In one embodiment, data pertaining to the control module 218 may be stored in one of the hysteresis data 220 and the controlling data 222.

The controller 126 is exemplary and should not limit the scope of the present disclosure. The functionality of the controller 126 described herein is also exemplary. The controller 126 may additionally include other components and capabilities not described herein. The machine 100 may additionally include any number of. Further, architecture and capabilities of the controller 126 may vary without any limitation.

The controller 126 is communicably connected to the actuating members 128 using any of the wired networks 127, known in the art. The actuating members 128 may include, but are not limited to, an electric drive motor arrangement, a generator 134, a traction motor 136, a transmission unit inclusive of gears 138, drive shafts 140, and other known drive links provided for transferring of power from the engine 104 to the plurality of ground engaging members 106. In another example, the actuating members 128 also include a steering control system 130 and an implement control system 132 in the machine 100. Owing to the coupling, the controller 126 of the control system 122 may selectively direct the output signals to the actuating members 128. The actuating members 128 are actuated based on the output signal generated by the controller 126. The actuating members 128 may control the operations of the machine 100 based on the output signal.

Figure 3:
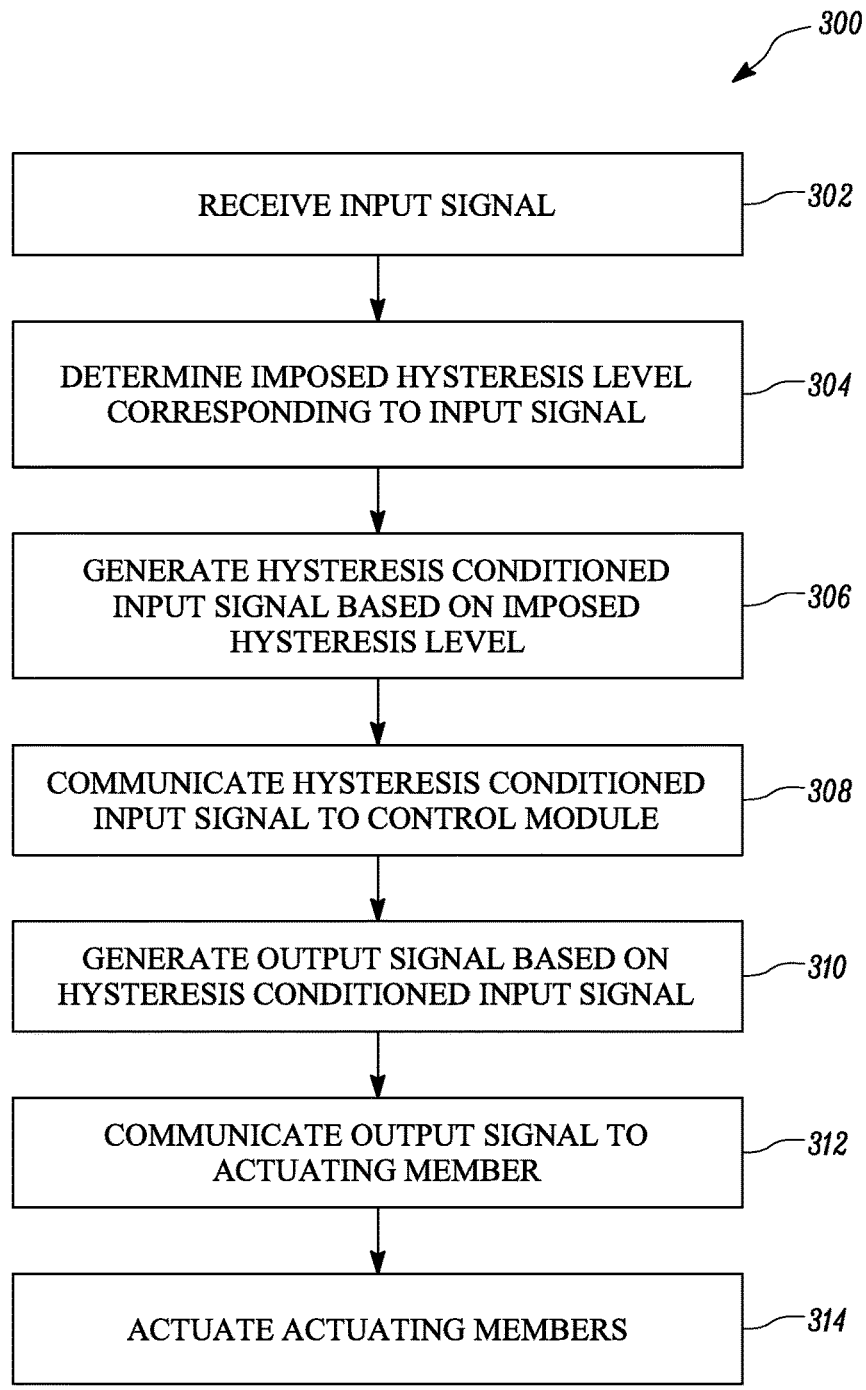
FIG. 3 is a flow diagram of a method of controlling operations of the machine of FIG. 1 using the control system, according to one embodiment of present disclosure.

FIG. 3 is a flow diagram of a method 300 of controlling operations of the machine 100 using the control system 122. At a step 302 of the method 300, the input signal receiving module 212 of the controller 126 receives the input signal from the input sensors 124. The input signal receiving module 212 analyzes the received input signal and determines the input provided from the control elements 110. For example, if the slow down pedal 112 is depressed, the input signal receiving module 212 reads the input signal associated with the slow down pedal 112 and determines the input (i.e. angular displacement) provided by the operator to the slow down pedal 112. The input signal receiving module 212 transmits the input signal to the hysteresis input function module 214 of the controller 126.

At a step 304, the hysteresis input function module 214 further determines the imposed hysteresis level corresponding to the input signal using the hysteresis input function in the hysteresis input function module 214. The imposed hysteresis level may be pre-defined and/or variable during time variant machine operations and various machine conditions. An exemplary hysteresis input function is explained in detail with reference to FIG. 4. In one example, the hysteresis input function module 214 includes the set of computer readable instructions for determining the imposed hysteresis level. Further specifics of the imposed hysteresis level are explained in detail with reference to FIG. 5.

At a step 306, the hysteresis determining module 216 of the controller 126 generates the hysteresis conditioned input signal based on the input signal and the determined imposed hysteresis level. The hysteresis conditioned input signal is indicative of the control action corresponding to the input signal. At a step 308, the hysteresis conditioned input signal is communicated to the control module 218 embedded in the controller 126. At a step 310, the control module 218 generates the output signal for the actuating members 128. The output signal is generated based on the hysteresis conditioned input signal. At a step 312, the output signal is communicated to the actuating members 128 for further control action. The actuating members 128 generate an output actuating signal based on the output signal. At a step 314, the output actuating signal actuates the actuating members 128 for controlling the operation of the machine 100.

For example, the operator provides the input to go pedal 116 of the machine 100 for increasing the speed of the machine 100. Owing to the input, the input sensor 124 generates the input signal corresponding to the input. The controller 126 determines the imposed hysteresis level corresponding to the input based on the input signal. Further, the controller 126 generates the hysteresis conditioned input signal using the input signal and the imposed hysteresis level. The generated hysteresis conditioned input signal is used to generate the output signal indicative of increasing speed of the machine 100. The output signal may be communicated to the actuating members 128, such as the electric drive motor arrangement of the machine 100, and thereupon control the actuating members 128 as per the requirement of the operator of the machine 100.

Figure 4:
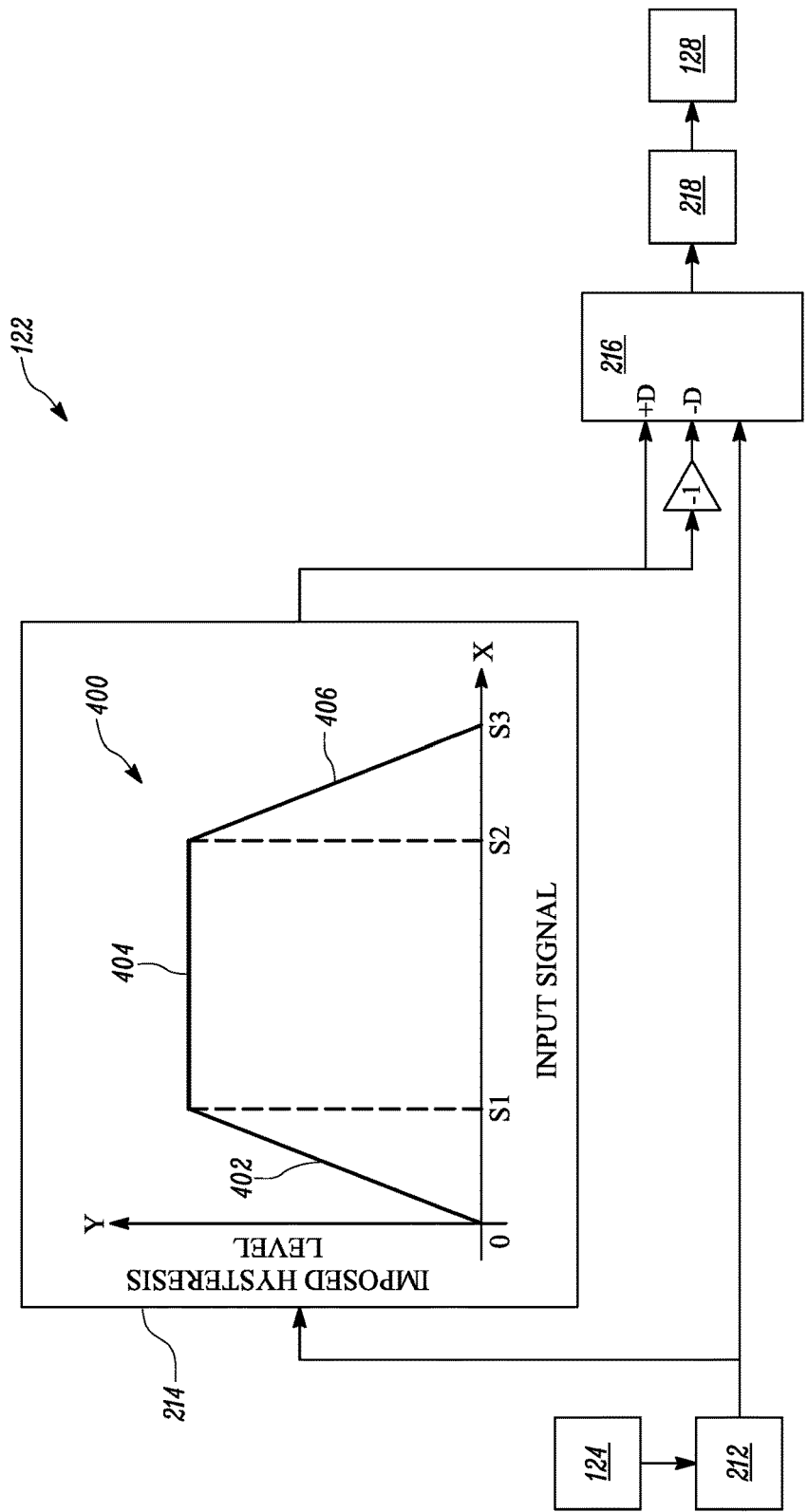
FIG. 4 illustrates a block diagram illustrating the control system and an exemplary hysteresis input function associated with the control system.

FIG. 4 illustrates a block diagram of the control system 122 and a graphical representation 400 of an exemplary hysteresis input function associated with the control system 122. As mentioned earlier, the input sensors 124 of the control system 122 receive the input signal from the control elements 110. The input signal receiving module 212 receives the input signal from the input sensors 124 and further transmits the input signal to the hysteresis input function module 214. The hysteresis input function module 214 determines the imposed hysteresis level corresponding to the input signal and the hysteresis input function.

The graphical representation 400 of the exemplary hysteresis input function is illustrated in FIG. 4. The graphical representation 400 illustrates a function that correlates the input signal versus the imposed hysteresis level along an X-axis and a Y-axis, respectively. As mentioned earlier, the hysteresis input function is the variable function of the input signal received from the input sensors 124. Hence, the imposed hysteresis level changes based on the input signal. In an example, the hysteresis input function may be a lookup table defined based on the input signal. The lookup tables may include the imposed hysteresis level corresponding to each of the input signal. A relation between the input signal and the imposed hysteresis level is explained in detail using an example by referring to FIG. 4.

Referring to FIG. 4 at an idle state of the machine 100, the slow down pedal 112 may be at an initial position and hence, the angular displacement of the slow down pedal 112 is zero. Hence, the input signal generated at the initial position is zero. Accordingly, the imposed hysteresis level is determined as zero. Further, when the operator provides the input to the slow down pedal 112, the position of the slow down pedal 112 is angularly displaced from the initial position to a second position. Accordingly, the input signal increases from zero to a first threshold input signal 'S1'. In one example, at a portion 402, as shown in FIG. 4, the imposed hysteresis level exhibits a gradual increase. In another embodiment, the imposed hysteresis level remains constant as the input signal increases from the zero to the first threshold input signal 'S1'.

Further, as the operator increases the input provided to the slow down pedal 112, the position of the slow down pedal 112 is angularly displaced from the second position to a third position. In such a scenario, the input signal starts increasing from the first threshold input signal 'S1' to a second threshold input signal 'S2' as shown at a portion 404. In the illustrated example, at the portion 404, as shown in FIG. 4, the imposed hysteresis level remains a constant as the input signal increases from the first threshold input signal 'S1' to the second threshold input signal 'S2'. In another example, the imposed hysteresis level value varies dynamically as the input signal increases from the first threshold input signal 'S1' to the second threshold input signal 'S2'.

On further increase of the input by the operator, the slow down pedal 112 is angularly displaced to a fourth position. Accordingly, the input signal increases and reaches a third threshold input signal 'S3'. In the illustrated example, at a portion 406 the imposed hysteresis level gradually decreases from constant to zero as the input signal increases from the second threshold input signal 'S2' to the third threshold input signal 'S3'. In another example, the imposed hysteresis level varies dynamically as the input signal increases from the second threshold input signal 'S2' to the third threshold input signal 'S3'. In one embodiment, the imposed hysteresis level remains constant as the input signal increases from the second threshold input signal 'S2' to the third threshold input signal 'S3'.

It may be contemplated that a rate of increase and decrease of the imposed hysteresis level may vary based on the type of control element 110 and the specification of the machine 100. Moreover, the constant may be computed based on the hysteresis input function corresponding to the type of control element 110 and the specification of the machine 100. In one example, a magnitude of the imposed hysteresis level in regions between the first threshold input signal 'S1' and the first threshold input signal 'S2' are noise in the input signal. In another example, the magnitude of the imposed hysteresis level may be an amount of oscillation and/or bounce interaction between the operator's foot/hand and the control element 110.

In one embodiment, the first threshold input signal 'S1' may be 5% of the input signal, the second threshold input signal 'S2' may be 95% of the input signal, the third threshold input signal 'S3' may be 100% of the input signal.

In another embodiment, the imposed hysteresis level may be zero for 0-5% of the input signal. When the input signal is above 5% or below 95% of the input signal, the machine 100 could be experiencing at least one of a noise, and oscillation and/or bounce interaction between the operator's foot/hand and the control element 110. This causes fluctuations in the input signal. Accordingly, the imposed hysteresis level is increased such that the hysteresis input function does not respond to the fluctuations in the input signal. For instance, the imposed hysteresis level can dynamically increase or decrease when the controller 126 detects an increased signal noise in the input signal. Similarly, the imposed hysteresis level can also dynamically increase or decrease when the controller 126 detects increased oscillation or bounce interaction between the operator's foot/hand and the control element 110. The imposed hysteresis level may be zero when the input signal is 95% to 100% of the input signal. In one example, if the operator depresses the slow down pedal 112 completely, then the hysteresis input function does not modify the input signal. Hence, imposed hysteresis level is zero.

The hysteresis input function module 214 communicates the imposed hysteresis level to the hysteresis determining module 216. The hysteresis determining module 216 generates the hysteresis conditioned input signal based on the imposed hysteresis level and the input signal. The hysteresis conditioned input signal is sent to the control module 218 for generating the output signal.

In one example, if the operator requires a stop command for obstacle avoidance, then the operator provides a complete input to the slow down pedal for stopping the machine 100. In such a scenario, the hysteresis input function removes the hysteresis when the input nears zero and thus the output is ultimately an operator expected zero speed command and a zero actual speed of the machine 100.

In another example, the operator provides the input to the steering lever inputs 120 to change the direction of movement of the machine 100. The steering lever input displacement sensors generates the input signal corresponding to the input provided maneuvering of the steering lever inputs 120. The controller 126 receives the input signal and determines the imposed hysteresis level corresponding to the input signal. Further, the controller 126 generates the hysteresis conditioned input signal based on the imposed hysteresis value and the input signal. The controller 126 generates the output signal based on the hysteresis conditioned input signal. The controller 126 communicates the output signal to the steering control system 130 (shown in FIG. 1) for enabling the operation corresponding to the input provided by the operator. The imposed hysteresis level varies based on the magnitude of the input signal.

In yet another example, the operator provides the input to the joystick 118 controlling the implement of the machine 100. The sensors associated with the joystick 118 generates input signal based on the input provided to the joystick 118. The controller 126 receives the input signal and determines the imposed hysteresis level corresponding to the input signal. Further, the controller 126 generates the hysteresis conditioned input signal based on the imposed hysteresis value and the input signal. The controller 126 generates the output signal based on the hysteresis conditioned input signal. The controller 126 communicates the output signal to the implement control system 132 (shown in FIG. 1) for enabling the operation corresponding to the input provided by the operator.

FIG. 5 is a graphical representation 500 of the input signal versus the hysteresis conditioned input signal. The magnitude of the input signal and the magnitude of the hysteresis conditioned input signal are plotted along an X axis and a Y axis, respectively. The graphical representation 500 includes a plot 502 illustrating a relationship of the hysteresis conditioned input signal generated by the controller 126 during an increase in the input signal. The graphical representation 500 also includes a plot 504 illustrating a relationship of the hysteresis conditioned input signal generated by the controller 126 during a decrease in the input signal. The imposed hysteresis level is a difference between the hysteresis conditioned input signal generated during the increase in the input signal and the hysteresis conditioned input signal generated during the decrease in the input signal.

It may be understood that a width of the imposed hysteresis level may vary for different types of machines based on at least one of, but not limited to, the specification of the machine 100 and the type of the control elements 110. For example, the imposed hysteresis level for the on-road machines is different from the imposed hysteresis level for off-road machines, due to a difference in the operating terrain conditions. Similarly, the imposed hysteresis level may also vary according to the type of the control elements 110 of the machine 100. For instance, the imposed hysteresis level for the go pedal 116 is different from the imposed hysteresis level for the slow down pedal 112. For instance, a wheel loader machine may pitch and thus cause a lot of undesired input from the operator on the control elements 110 such as the go pedal 116, the slow down pedal 112, and the clutch pedal 114 due to foot bouncing.

FIG. 5 illustrates the imposed hysteresis level corresponding to the go pedal 116. The operator provides an increasing input to the go pedal 116 and the input signal increases accordingly. Further, the hysteresis conditioned input signal increases based on the input signal. When, the operator begins releasing the go pedal 116, the input signal decreases. However, the hysteresis conditioned input signal may be desirably subjected to an offset or delay. The offset or delay as such is referred to as the imposed hysteresis level. The input at the go pedal 116 eventually goes to zero as the operator may require the machine 100 to come to a stop. In the preferred embodiment, the hysteresis input function gradually removes the imposed hysteresis level when the input nears zero and thus the hysteresis conditioned input signal is ultimately an operator expected zero speed command. In another embodiment, for the control elements 110 such as the steering lever inputs 120, the imposed hysteresis level may not be removed at higher input signals by the hysteresis input function.

INDUSTRIAL APPLICABILITY

The present disclosure relates to the control system 122 including the input sensors 124, the controller 126, and the actuating members 128 of the machine 100. The input sensors 124 generate the input signals corresponding to the input provided the operator to the control elements 110. The controller 126 includes the hysteresis input function module 214 and the hysteresis determining module 216. When the operator provides the input to the control elements 110, the output signal supplied to the actuating members 128 may be subjected to an offset or delay. The change in input signal that is required to make a change in hysteresis conditioned input signal may be referred to as the imposed hysteresis level. The imposed hysteresis level may be used as a filter for eliminating noise in the input signal. The imposed hysteresis level restricts the controller 126 from responding to any input signal generated due to an unintentional movement of the control elements 110 due to uneven operating terrain conditions or an unintentional input provided by the operator. Hence, the hysteresis conditioned input signal may be generated by the controller 126 for a valid input from the operator.

Further, the controller 126 removes the operator unexpected imposed hysteresis level. For example, the controller 126 removes the imposed hysteresis level when the input nears zero and thus the output signal is ultimately an operator expected zero input command. The controller 126 aids in restricting the imposed hysteresis level during zero input conditions and maximum input conditions based on the hysteresis input signal. Similarly, the controller 126 removes the imposed hysteresis level when the input nears maximum and thus the hysteresis conditioned input signal is ultimately an operator expected maximum input command. Also, the hysteresis input function prevents the operator from experiencing a distinct offset or delay in operation around zero speed.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A control system for a machine having at least one control element, the control system comprising:
   at least one input sensor in communication with the at least one control element, to generate an input signal indicative of an input to the at least one control element provided by an operator of the machine to control movement of the machine;
   at least one actuating member configured to control at least one operation of the machine; and
   a controller in communication with each of the at least one input sensor and the at least one actuating member, the controller being configured to:
      receive, from the at least one input sensor, the input signal indicative of the input to the at least one control element provided by the operator of the machine;
      determine an imposed hysteresis level corresponding to the input signal generated by the at least one input sensor, based on a shaped hysteresis input function that has as an input the input signal generated by the at least one input sensor and that selectively imposes hysteresis on the input signal;
      generate a hysteresis conditioned input signal based on the imposed hysteresis level;
      generate an output signal based on the hysteresis conditioned input signal and based on the input signal generated by the at least one input sensor bypassing the shaped hysteresis input function; and
      communicate the output signal to enact an operation corresponding to the input provided by the operator of the machine to control movement of the machine.

2. The control system of claim 1,
   wherein the controller is further configured to:
   generate an output actuating signal based on the output signal that is generated based on the hysteresis conditioned input signal and based on the input signal generated by the at least one input sensor that bypasses the shaped hysteresis input function, and
   wherein the output actuating signal actuates the at least one actuating member to control the at least one operation of the machine.

3. The control system of claim 2, wherein the controller is further configured to:
   communicate the output actuating signal to at least one actuating member such that the at least one actuating member controls the at least one operation of the machine based on the output actuating signal.

4. The control system of claim 1, wherein the shaped hysteresis input function comprises a set of input signals and the imposed hysteresis level corresponding to each of the input signals from the set of input signals.

5. The control system of claim 4, wherein the imposed hysteresis level is:
   zero when the input signal is zero; and
   varied when the input signal increases from at least one of zero and a first threshold input signal to a second threshold input signal.

6. The control system of claim 5, wherein the imposed hysteresis level is:
   zero at a maximum input signal when the input signal increases from the second threshold input signal to a third threshold input signal.

7. The control system of claim 1,
   wherein the shaped hysteresis input function outputs zero for the imposed hysteresis level at a lower band of input values for the input signal and/or outputs zero for the imposed hysteresis level at an upper band of input values for the input signal, and
   wherein the shaped hysteresis input function outputs a non-zero value for the imposed hysteresis level for values of the input signal between the lower band of input values and the upper band of input values.

8. A method of controlling operations of a machine having at least one control element, the method comprising:
   receiving an input signal indicative of an input to at least one control element provided by an operator of the machine to control movement of the machine;
   determining an imposed hysteresis level corresponding to the input signal using a shaped hysteresis input function that has as an input the input signal and that selectively imposes hysteresis on the input signal;
   generating a hysteresis conditioned input signal based on the imposed hysteresis level;
   generating an output signal based on the hysteresis conditioned input signal and based on the input signal bypassing the shaped hysteresis input function; and
   communicating the output signal to enact an operation corresponding to the input provided by the operator of the machine to control movement of the machine.

9. The method of claim 8 further comprising:
generating an output actuating signal based on the output signal generated based on the determined hysteresis conditioned input signal and based on the input signal bypassing the shaped hysteresis input function, wherein the output actuating signal actuates the at least one actuating member to control at least one operation of the machine.

10. The method of claim 8 further comprising:
communicating the output signal to at least one actuating member such that the at least one actuating member controls the at least one operation of the machine based on the output signal.

11. The method of claim 8, wherein the shaped hysteresis input function comprises a set input signals and the imposed hysteresis level corresponding to each of the input signals from the set of input signals.

12. The method of claim 8, wherein the imposed hysteresis level is:
zero when the input signal is zero; and
varied when the input signal increases from at least one of zero and a first threshold input signal to a second threshold input signal.

13. The method of claim 12, wherein the imposed hysteresis level is:
zero at a maximum input signal when the input signal increases from the second threshold input signal to a third threshold input signal.

14. A vehicle comprising:
at least one control element; and
a control system, the control system comprising:
at least one input sensor in communication with the at least one control element to generate an input signal indicative of an input to the at least one control element provided by an operator of the vehicle to control movement of the vehicle;
at least one actuating member configured to control at least one operation of the vehicle; and
a controller in communication with each of the at least one input sensor and the at least one actuating member, the controller being configured to:
receive, from the at least one input sensor, the input signal indicative of the input to the at least one control element provided by the operator of the vehicle;
determine a imposed hysteresis level corresponding to the input signal generated by the at least one input sensor based on a shaped hysteresis input function that has as an input the input signal generated by the at least one input sensor and that selectively imposes hysteresis on the input signal;
generate a hysteresis conditioned input signal based on the imposed hysteresis level;
generate an output signal based on the hysteresis conditioned input signal and based on the input signal generated by the at least one input sensor bypassing the shaped hysteresis input function; and
communicate the output signal to enact an operation corresponding to the input provided by the operator of the vehicle to control movement of the vehicle.

15. The vehicle of claim 14, wherein the controller is further configured to:
generate an output actuating signal based on the output signal that is generated based on the hysteresis conditioned input signal and based on the input signal generated by the at least one input sensor bypassing the shaped hysteresis input function, wherein the output actuating signal actuates the at least one actuating member to control the at least one operation of the vehicle.

16. The vehicle of claim 14, wherein the controller is further configured to:
communicate the output signal to at least one actuating member such that the at least one actuating member controls the at least one operation of the vehicle based on the output signal.

17. The vehicle of claim 14, wherein the shaped hysteresis input function comprises a set input signals and the imposed hysteresis level corresponding to each of the input signals from the set of input signals.

18. The vehicle of claim 14, wherein the imposed hysteresis level is:
zero when the input signal is zero; and
varied when the input signal increases from at least one of zero and a first threshold input signal to a second threshold input signal.

19. The vehicle of claim 18, wherein, the imposed hysteresis level is:
zero at a maximum input signal when the input signal increases from the second threshold input signal to a third threshold input signal.

20. The vehicle of claim 14,
wherein the shaped hysteresis input function outputs zero for the imposed hysteresis level at a lower band of input values for the input signal and outputs zero for the imposed hysteresis level at an upper band of input values for the input signal, and
wherein the shaped hysteresis input function outputs a non-zero value for the imposed hysteresis level for values of the input signal between the lower band of input values and the upper band of input values.

* * * * *